US011056975B2

(12) United States Patent
Hata

(10) Patent No.: US 11,056,975 B2
(45) Date of Patent: Jul. 6, 2021

(54) VOLTAGE CONVERSION DEVICE

(71) Applicant: DENSO CORPORATION, Kariya (JP)

(72) Inventor: Keisuke Hata, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/750,466

(22) Filed: Jan. 23, 2020

(65) Prior Publication Data

US 2020/0287462 A1   Sep. 10, 2020

(30) Foreign Application Priority Data

Mar. 5, 2019 (JP) .............................. JP2019-039707

(51) Int. Cl.
| | |
|---|---|
| *H02M 3/158* | (2006.01) |
| *H02M 1/00* | (2006.01) |
| *G01R 19/25* | (2006.01) |
| *H02P 27/06* | (2006.01) |

(52) U.S. Cl.
CPC ........ *H02M 3/158* (2013.01); *G01R 19/2506* (2013.01); *H02M 1/00* (2013.01); *H02M 2001/0009* (2013.01); *H02P 27/06* (2013.01)

(58) Field of Classification Search
CPC .................. H02M 1/00; H02M 3/158; H02M 2001/0009; H02H 7/06–097; H02H 7/1213; H02P 27/06; G01R 19/2506
See application file for complete search history.

(56) References Cited

U.S. PATENT DOCUMENTS

| | | | |
|---|---|---|---|
| 9,899,916 B2* | 2/2018 | Okamura | B60L 15/007 |
| 2009/0301801 A1* | 12/2009 | Fujitake | B60L 53/30 |
| | | | 180/65.29 |
| 2014/0327431 A1 | 11/2014 | Nakamura et al. | |
| 2016/0332529 A1* | 11/2016 | Kumazawa | B60L 15/007 |
| 2017/0331401 A1* | 11/2017 | Sambonsuge | G01R 19/15 |
| 2018/0175776 A1* | 6/2018 | Tsujii | B60L 15/2045 |
| 2018/0178654 A1* | 6/2018 | Nishimura | B60L 53/24 |
| 2018/0229622 A1* | 8/2018 | Matsumoto | H01M 8/04888 |
| 2018/0316259 A1* | 11/2018 | Tsujii | B60L 50/51 |
| 2019/0181758 A1* | 6/2019 | Satoh | H02M 3/1582 |

FOREIGN PATENT DOCUMENTS

| | | |
|---|---|---|
| JP | 2006-115643 A | 4/2006 |
| JP | 2014-219239 A | 11/2014 |

* cited by examiner

*Primary Examiner* — Rafael O De Leon Domenech
(74) *Attorney, Agent, or Firm* — Sughrue Mion, PLLC

(57) ABSTRACT

There is provided a voltage conversion device that is configured to perform zero point adjustment of a high voltage-system voltage detected by a high voltage-system voltage detector, when a relay is off. The voltage conversion device is also configured to estimate a forward voltage of an upper arm diode and to perform output adjustment of the high voltage-system voltage detected by the high voltage-system voltage detector, based on a voltage calculated by subtracting the forward voltage from a power storage voltage detected by a power storage voltage detector, when the relay is on, a low voltage-system power line has no electric power consumption, and a voltage conversion circuit does not perform voltage conversion. The voltage conversion device is further configured to create a high voltage-system voltage correction map, based on results of the zero point adjustment and the output adjustment of the high voltage-system voltage.

5 Claims, 10 Drawing Sheets

VOLTAGE CONVERSION DEVICE

CROSS-REFERENCE TO RELATED APPLICATION

This application claims priority to Japanese Patent Application No. 2019-039707 filed on Mar. 5, 2019, the contents of which is incorporated herein by reference.

TECHNICAL FIELD

The present disclosure relates to a voltage conversion device including a voltage conversion circuit, a low voltage-system voltage detector and a high voltage-system voltage detector.

BACKGROUND

A proposed configuration of a voltage conversion device includes a boost converter; a system main relay provided in a low voltage-side power line placed between a battery and the boost converter; and an electric load circuit provided in the low voltage-side power line (as described in, for example, JP 2006-115643A). This voltage conversion device further includes a capacitor provided in a low voltage-side power line of the boost converter; a capacitor provided in a high voltage-side power line of the boost converter; a discharge resistance configured to discharge an electric charge of the high voltage-side capacitor; a VL sensor configured to detect a voltage of the low voltage-side capacitor; a VH sensor configured to detect a voltage of the high voltage-side capacitor; and a VB sensor configured to detect a voltage of the battery. When the system main relay is not ON, this voltage conversion device performs zero point correction (zero point adjustment) of the VL sensor and the VH sensor. When the system main relay is ON and the electric load circuit is not powered ON, this voltage conversion device uses an output value of the VB sensor to correct an output point of the VL sensor (output adjustment) and creates a characteristic correction equation or a characteristic map of the VL sensor by using the corrected zero point and the corrected output point of the VL sensor. Furthermore, when the system main relay is ON, the electric load circuit is not powered ON, and the boost converter is not ON, this voltage conversion device uses the output value of the VB sensor to correct an output point of the VH sensor and creates a characteristic correction equation or a characteristic map of the VH sensor by using the corrected zero point and the corrected output point of the VH sensor.

CITATION LIST

Patent Literature

PTL 1: JP2006-115643A

The boost converter may be configured as a step-up chopper circuit that includes an upper arm switching element, a lower arm switching element connected in series with the upper arm switching element, an upper arm diode connected in parallel with the upper arm switching element in a reverse direction, and a lower arm diode connected in parallel with the lower arm switching element in the reverse direction. As described in JP 2006-115643A, in the state that the discharge resistance is connected in parallel with the high voltage-side capacitor, the electric charge of the high voltage-side capacitor is discharged by means of the discharge resistance even when the system main relay is ON, the electric load circuit is not powered ON, and the boost converter is not ON. This generates charge current flowing from the battery through a reactor and the upper arm diode toward the high voltage-side capacitor. In this case, a forward voltage is likely to be applied to the upper arm diode (voltage drop) and thereby affect the detection of the VH sensor. There is accordingly a likelihood of inappropriate output adjustment of the VH sensor.

A main object of a voltage conversion device of the present disclosure is to more appropriately correct a low voltage-system voltage and a high voltage-system voltage.

SUMMARY

In order to achieve the above primary object, the voltage conversion device of the disclosure is implemented by an aspect described below.

The present disclosure is directed to a voltage conversion device. The voltage conversion device includes a voltage conversion circuit that includes an upper arm switching element, a lower arm switching element connected in series with the upper arm switching element, an upper arm diode connected in parallel with the upper arm switching element in a reverse direction, a lower arm diode connected in parallel with the lower arm switching element in the reverse direction, and a reactor connected between the upper arm switching element and the lower arm switching element and that is placed between a low voltage-system power line connected with a power storage device and a high voltage-system power line connected with an electric load to perform voltage conversion, a low voltage-system capacitor provided on the low voltage-system power line, a high voltage-system capacitor provided on the high voltage-system power line, a discharge element configured to discharge an electric charge of the high voltage-system capacitor, a low voltage-system voltage detector configured to detect a low voltage-system voltage that is a voltage of the low voltage-system capacitor, a high voltage-system voltage detector configured to detect a high voltage-system voltage that is a voltage of the high voltage-system capacitor, a power storage voltage detector configured to detect a power storage voltage that is a voltage of the power storage device, a relay that is provided on the low voltage-system power line, and a control device configured to use a low voltage-system voltage correction map or a low voltage-system voltage correction equation to correct the low voltage-system voltage detected by the low voltage-system voltage detector and to use a high voltage-system voltage correction map or a high voltage-system voltage correction equation to correct the high voltage-system voltage detected by the high voltage-system voltage detector. When the relay is off, the control device performs zero point adjustment of the low voltage-system voltage detected by the low voltage-system voltage detector; and performs zero point adjustment of the high voltage-system voltage detected by the high voltage-system voltage detector. When the relay is on and the low voltage-system power line has no electric power consumption, the control device performs output adjustment of the low voltage-system voltage detected by the low voltage-system voltage detector, based on the power storage voltage detected by the power storage voltage detector; and creates the low voltage-system voltage correction map or the low voltage-system voltage correction equation, based on results of the zero point adjustment and the output adjustment of the low voltage-system voltage. And when the relay is on, the low voltage-system power line has no electric power consumption, and the voltage conversion circuit does not perform voltage conversion, the control device estimates a forward voltage of the upper arm diode; performs output adjustment of the high voltage-system voltage detected by the high voltage-system voltage detector, based on a voltage calculated by subtracting the forward voltage from the power storage voltage detected by the power storage voltage detector or based on a voltage calculated by subtracting the forward voltage from a corrected voltage, which is obtained by correcting the low voltage-system voltage detected by the low voltage-system voltage detector; and creates the high voltage-system voltage correction map or the high voltage-system voltage correction equation, based on results of the zero point adjustment and the output adjustment of the high voltage-system voltage.

The voltage conversion device according to this aspect of the present disclosure uses the low voltage-system voltage correction map or the low voltage-system voltage correction equation to correct the low voltage-system voltage detected by the low voltage-system voltage detector, while using the high voltage-system voltage correction map or the high voltage-system voltage correction equation to correct the high voltage-system voltage detected by the high voltage-system voltage detector. Creation of the low voltage-system voltage correction map or the low voltage-system voltage correction equation and creation of the high voltage-system voltage correction map or the high voltage-system voltage correction equation may be performed as described below. When the relay is off, the voltage conversion device performs zero point adjustment of the low voltage-system voltage detected by the low voltage-system voltage detector and also performs zero point adjustment of the high voltage-system voltage detected by the high voltage-system voltage detector. When the relay is on and the low voltage-system power line has no electric power consumption, the voltage conversion device performs output adjustment of the low voltage-system voltage detected by the low voltage-system voltage detector, based on the power storage voltage detected by the power storage voltage detector. The voltage conversion device then creates the low voltage-system voltage correction map or the low voltage-system voltage correction equation, based on the results of the zero point adjustment and the output adjustment of the low voltage-system voltage. This configuration enables the low voltage-system voltage to be corrected appropriately. When the relay is on, the low voltage-system power line has no electric power consumption and the voltage conversion circuit does not perform voltage conversion, the voltage conversion device estimates the forward voltage of the upper arm diode, and performs output adjustment of the high voltage-system voltage detected by the high voltage-system voltage detector, based on the voltage calculated by subtracting the forward voltage from the power storage voltage detected by the power storage voltage detector or based on the voltage calculated by subtracting the forward voltage from the corrected voltage that is obtained by correcting the low voltage-system voltage detected by the low voltage-system voltage detector. The voltage conversion device then creates the high voltage-system voltage correction map or the high voltage-system voltage correction equation, based on the results of the zero point adjustment and output adjustment of the high voltage-system voltage. The capacitor (high voltage-system capacitor) and the discharge element are connected with the high voltage-system power line. When the operation of the voltage conversion circuit is stopped, charge current flows from the power storage device through the reactor and the upper arm diode toward the capacitor, accompanied with discharge of the capacitor by means of the discharge element. At this time, the forward voltage is applied to the upper arm diode, so that the capacitor is charged with a power having a voltage that is reduced from the power storage voltage by the forward voltage. The voltage conversion device accordingly performs output adjustment of the high voltage-system voltage detected by the high voltage-system voltage detector, based on the value obtained by subtracting the forward voltage from the power storage voltage or from the corrected voltage that is obtained by correcting the low voltage-system voltage. This configuration ensures the more appropriate output adjustment. As a result, this configuration enables the high voltage-system voltage to be corrected more appropriately.

DESCRIPTION OF EMBODIMENTS

The following describes some aspects of the present disclosure with reference to an embodiment.

First Embodiment

Figure 1:
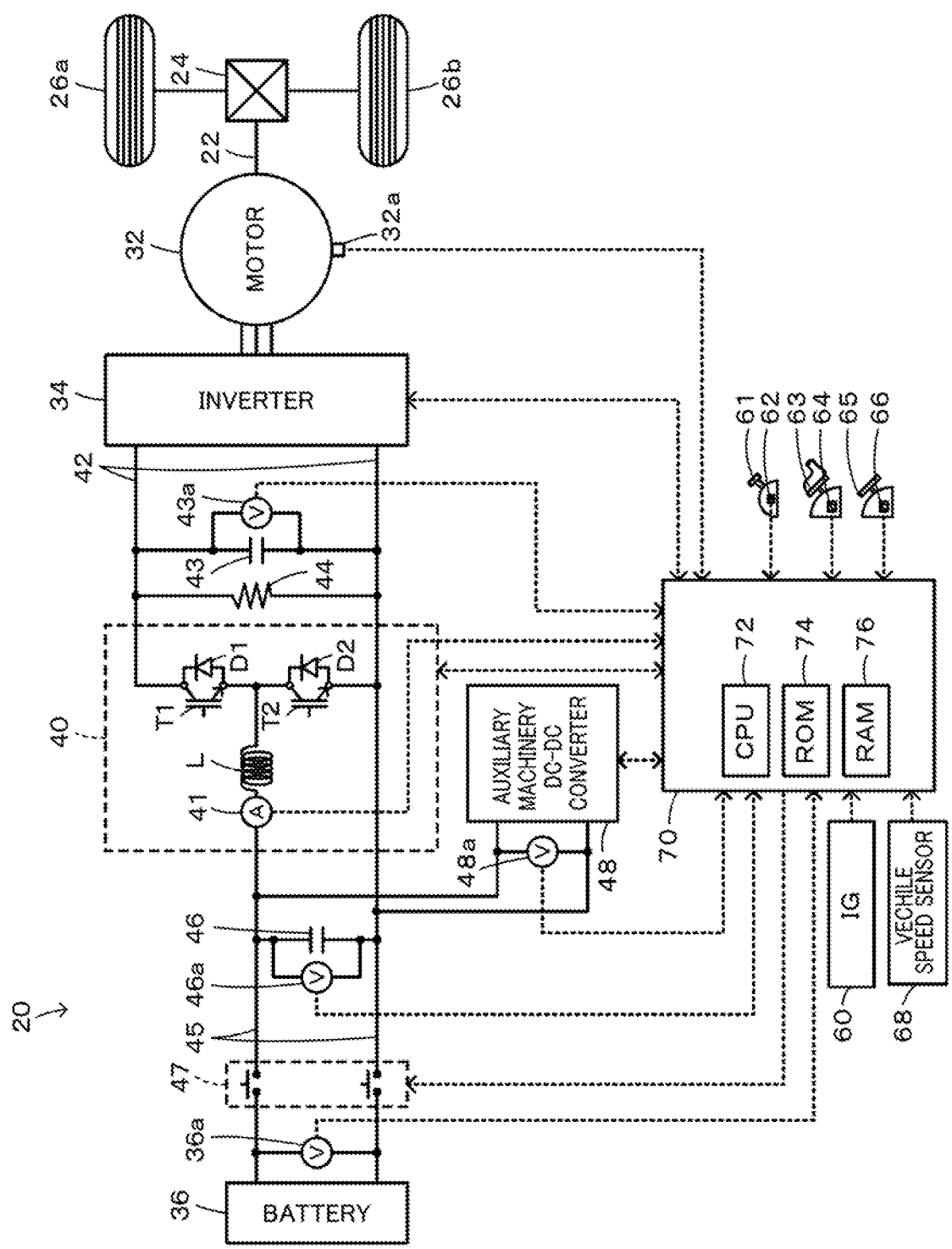
FIG. 1 is a configuration diagram illustrating the schematic configuration of an electric vehicle including a voltage conversion device according to a first embodiment of the present disclosure.

FIG. 1 is a configuration diagram illustrating the schematic configuration of an electric vehicle 20 including a voltage conversion device according to a first embodiment of the present disclosure. As illustrated, the electric vehicle 20 of the embodiment includes a motor 32, an inverter 34, a battery 36, a boost converter 40 and an electronic control unit 70.

The motor 32 is configured as a synchronous generator motor having a rotor with permanent magnets embedded therein and a stator with three-phase coils wound thereon. This motor 32 includes a rotor that is connected with a driveshaft 22 that is linked with drive wheels 26a and 26b via a differential gear 24.

The inverter 34 is connected with the motor 32 and with high voltage-system power lines 42. This inverter 34 is configured as a known inverter circuit including six transistors and six diodes that are connected in parallel with the six transistors in a reverse direction. A smoothing capacitor 43 and a discharge resistance 44 are connected with a positive bus bar and a negative bus bar of the high voltage-system power lines 42 such as to be arranged in parallel to each other.

The boost converter 40 is connected with the high voltage-system power lines 42 that is connected with the inverter 34, and with low voltage-system power lines 45 that is connected with the battery 36 via a system main relay 47. This boost converter 40 includes two transistors T1 and T2, two diodes D1 and D2, and a reactor L. The transistor T1 is connected with the positive bus bar of the high voltage-system power lines 42. The transistor T2 is connected with the transistor T1, with the negative bus bar of the high voltage-system power lines 42 and with a negative bus bar of the low voltage-system power lines 45. The transistor T1 and the transistor T2 are connected in series with each other. The two diodes D1 and D2 are respectively connected in parallel with the transistors T21 and T22 in a reverse direction. In the description hereof, the transistor T1 is also called "upper arm transistor" and the transistor T2 is also called "lower arm transistor". The diode D1 is also called "upper arm diode", and the diode D2 is also called "lower arm diode". The reactor L is connected with a connecting point between the transistors T1 and T2 and with a positive bus bar of the low voltage-system power lines 45. The electronic control unit 70 regulates a ratio of ON times of the transistors T1 and T2 (duty ratio), such as to cause the boost converter 40 to step up the voltage of the power of the low voltage-system power lines 45 and supply the power of the stepped-up voltage to the high voltage-system power lines 42 and to step down the voltage of the power of the high voltage-system power lines 42 and supply the power of the stepped-down voltage to the low voltage-system power lines 45. A smoothing capacitor 46 is connected with the positive bus bar and the negative bus bar of the low voltage-system power lines 45.

An auxiliary machinery DC-DC converter 48 is also connected with the positive bus bar and the negative bus bar of the low voltage-system power lines 45 and is configured to step down the voltage of the power of the low voltage-system power lines 45 and supply the power of the stepped-down voltage to non-illustrated auxiliary machines (for example, a power-driven compressor of an air conditioning system and a low voltage battery).

The battery 36 is configured as, for example, a nickel metal hydride battery or a lithium ion rechargeable battery and is connected with the low voltage-system power lines 45 via the system main relay 47.

The electronic control unit 70 is configured as a CPU 72-based microprocessor and includes a ROM 74 configured to store processing programs, a RAM 76 configured to temporarily store data, and input/output ports (not shown), in addition to the CPU 72. Signals from various sensors used to control the motor 32 are input into the electronic control unit 70. The signals input into the electronic control unit 70 include, for example, a rotation position of the rotor of the motor 32 from a rotation position detection sensor 32a configured to detect the rotation position of the rotor of the motor 32, and phase currents from current sensors (not shown) mounted to the respective phase coils of the motor 32. The input signals also include a reactor current IL from a current sensor 41 mounted to the positive bus bar of the low voltage-system power lines 45, a high voltage-system voltage VH from a voltage sensor 43a placed between terminals of the capacitor 43, a low voltage-system voltage VL from a voltage sensor 46a placed between terminals of the capacitor 46, and a low voltage-system voltage VL2 from a voltage sensor 48a placed between input terminals (terminals on the low voltage-system power lines 45-side) of the auxiliary machinery DC-DC converter 48. For example, a circuit using an operational amplifier and a resistance may be employed for the voltage sensors 43a, 46a and 48a. In another example, a circuit using an isolation amplifier may also be employed for the voltage sensors 43a, 46a and 48a. In order to provide an insulation resistance between the high voltage side and the low voltage side, the input resistance preferably has a high impedance (for example, 4 MΩ to 40 MΩ). The input signals additionally include a battery voltage VB from a voltage sensor 36a placed between output terminals of the battery 36, a charge-discharge current from a current sensor (not shown) connected with the output terminal of the battery 36, and a battery temperature from a temperature sensor (not shown) mounted to the battery 36. The voltage sensor 36a is configured to detect the voltage with the higher accuracy (with the smaller error), compared with the voltage sensors 43a and 46a. The voltage sensor 36a may be, for example, a resistance voltage divider type or a flying capacitor type.

The electronic control unit 70 also serves as a drive control device of the vehicle, so that information required for drive control is also input into the electronic control unit 70. Examples of such information include an ignition signal from an ignition switch 60, a shift position SP from a shift position sensor 62 configured to detect an operating position of a shift lever 61, an accelerator position Acc from an accelerator pedal position sensor 64 configured to detect a depression amount of an accelerator pedal 63, a brake pedal position BP from a brake pedal position sensor 66 configured to detect a depression amount of a brake pedal 65, and a vehicle speed V from a vehicle speed sensor 68.

The electronic control unit 70 outputs, for example, switching control signals to the transistors of the inverter 34, switching control signals to the transistors T1 and T2 of the boost converter 40, a control signal to the auxiliary machinery DC-DC converter 48 and a drive signal to the system main relay 47 via the output port.

According to the first embodiment, the boost converter 40, the system main relay 47, the capacitor 43, the discharge resistance 44, the capacitor 46, the voltage sensor 43a, the voltage sensor 46a, the voltage sensor 36a and the electronic control unit 70 constitute the voltage conversion device.

In response to an ON operation of the ignition switch 60 to make a request for a system start, the electric vehicle 20 having the above configuration checks whether the vehicle is in a state that is ready for a system start and then turns on the system main relay 47 to be in a ready-on state. In the ready-on state, the electric vehicle 20 is drivable. The electric vehicle 20 of the embodiment performs zero point adjustment of the voltage sensors 43a and 46a prior to turning on of the system main relay 47, and performs output adjustment of the voltage sensors 43a and 46a to regulate the detection errors of the voltage sensor 43a and 46a with regard to the low voltage-system voltage VL detected by the voltage sensor 46a and the high voltage-system voltage VH detected by the voltage sensor 43a after turning on of the system main relay 47. The electric vehicle 20 then creates voltage correction maps (a VL correction map and a VH correction map) used to correct the low voltage-system voltage VL detected by the voltage sensor 46a and the high voltage-system voltage VH detected by the voltage sensor 43a, based on the results of the zero point adjustment and the output adjustment. The voltage correction maps are created according to a voltage correction map creating process shown in FIG. 2. After the ON operation of the ignition switch 60, the voltage correction map creating process is performed repeatedly at predetermined time intervals (for example, at every several msec) until completion of the correction maps. In other words, according to the embodiment, the correction maps are created once during one trip (time period from an ON operation to an OFF operation of the ignition switch 60).

When the voltage correction map creating process is triggered, the CPU 72 of the electronic control unit 70 first determines whether the system main relay 47 is OFF (step S100). When it is determined that the system main relay 47 is OFF, the CPU 72 obtains the inputs of the low voltage-system voltage VL from the voltage sensor 46*a* and the high voltage-system voltage VH from the voltage sensor 43*a* (step S110), performs zero point adjustment of the input low voltage-system voltage VL and zero point adjustment of the input high voltage-system voltage VH (step S120) and then terminates this process. A procedure of the zero point adjustment of the low voltage-system voltage VL and the high voltage-system voltage VH sets the input low voltage-system voltage VL and the input high voltage-system voltage VH to zero point adjustment values (a VL zero point adjustment value $\Delta VL0$ and a VH zero point adjustment value $\Delta VH0$) and stores the respective zero point adjustment values $\Delta VL0$ and $\Delta VH0$ into a predetermined area of the RAM 76.

Figure 3:
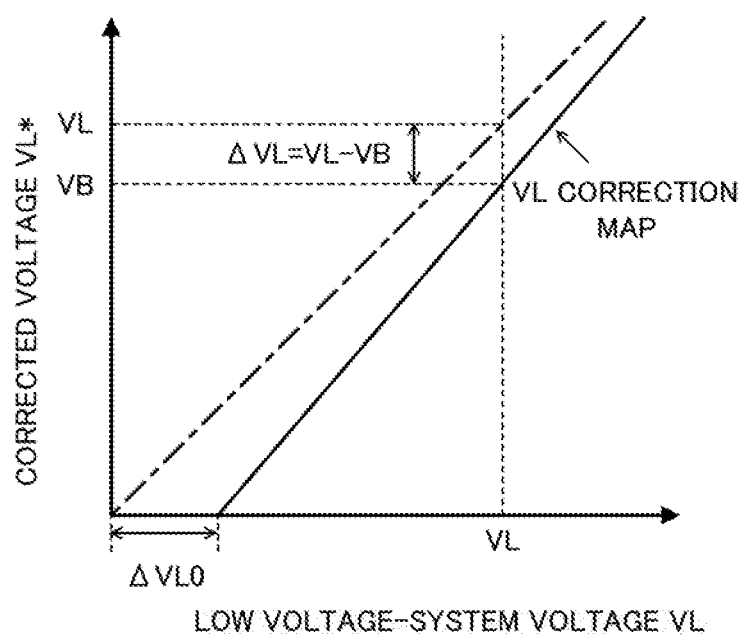
FIG. 3 is a diagram illustrating a procedure of creating a VL correction map.

When it is determined at step S100 that the system main relay 47 is ON, on the other hand, the CPU 72 determines whether the operation of the auxiliary machinery DC-DC converter 48 (power feed operation) is stopped (step S130) and also determines whether the operation of the inverter 34 (i.e., the drive operation of the motor 32) is stopped (step S140). When it is determined that the operation of the auxiliary machinery DC-DC converter 48 is not stopped or when it is determined that the operation of the inverter 34 is not stopped, i.e., when it is determined that either the auxiliary machinery DC-DC converter 48 or the inverter 34 is operated, the CPU 72 prohibits output adjustment of the low voltage-system voltage VL (step S150) and then terminates this process. When it is determined that both the operation of the auxiliary machinery DC-DC converter 48 and the operation of the inverter 34 are stopped, on the other hand, the CPU 72 obtains the inputs of the low voltage-system voltage VL from the voltage sensor 46*a* and the battery voltage VB from the voltage sensor 36*a* (step S160) and subsequently performs output adjustment of the low voltage-system voltage VL, based on the input battery voltage VB (step S170). A procedure of the output adjustment of the low voltage-system voltage VL sets a value obtained by subtracting the input battery voltage VB from the input low voltage-system voltage VL, to a VL output adjustment value $\Delta VL$ and stores the VL output adjustment value $\Delta VL$ into a predetermined area of the RAM 76. After storing the VL zero point adjustment value $\Delta VL0$ and the VL output adjustment value $\Delta VL$, the CPU 72 creates a VL correction map that is used for correction of the low voltage-system voltage VL detected by the voltage sensor 46*a* (step S180). FIG. 3 is a diagram illustrating a procedure of creating the VL correction map. In this diagram, an abscissa shows the low voltage-system voltage VL detected by the voltage sensor 46*a*, and an ordinate shows a corrected voltage VL* after correction of the low voltage-system voltage VL. As illustrated, the procedure of creating the VL correction map sets combinations of the low voltage-system voltage VL and the corrected voltage VL* on a straight line passing through two points ($\Delta VL0$, 0) and (VL, VL–$\Delta VL$) in a plane defined by the abscissa and the ordinate.

Figure 4:
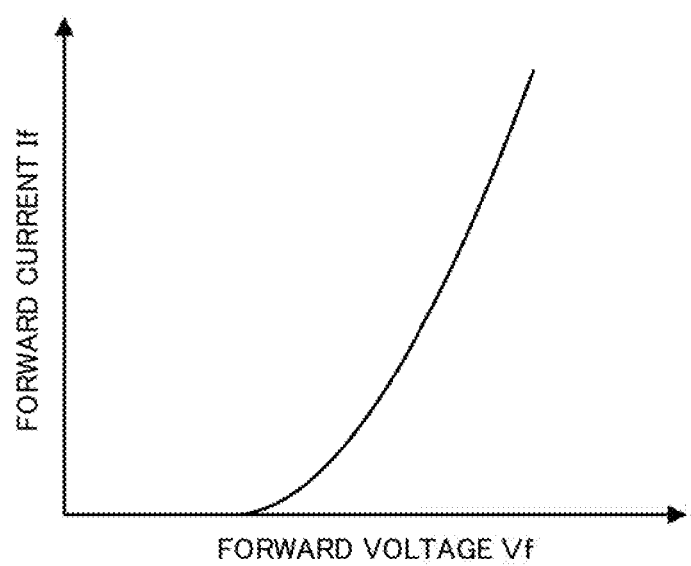
FIG. 4 is a diagram illustrating one example of a forward voltage setting map (current voltage characteristic) of a diode D1.
Figure 5:
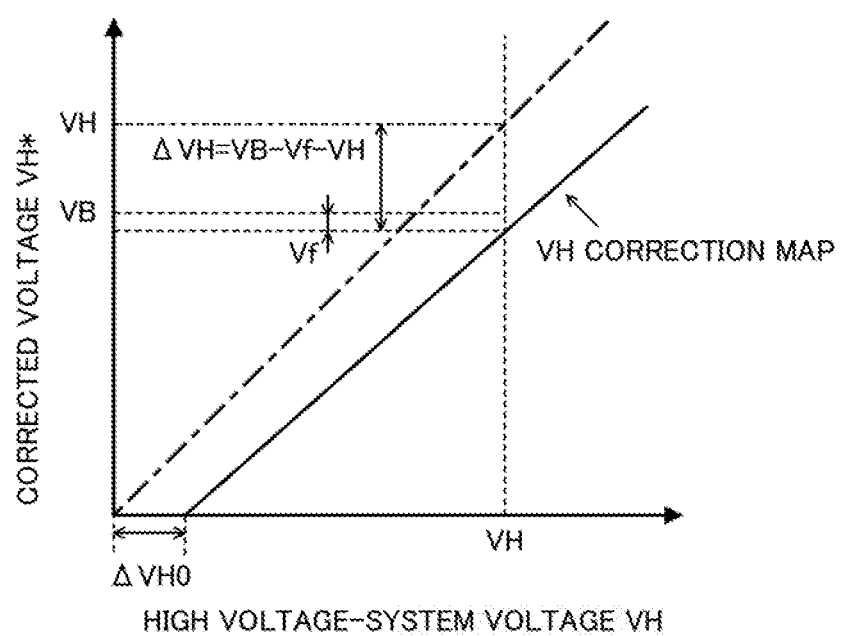
FIG. 5 is a diagram illustrating a procedure of creating a VH correction map.

The CPU 72 subsequently determines whether the operation of the boost converter 40 (voltage converting operation) is stopped (step S190). When it is determined that the boost converter 40 does not stop operation but is operated, the CPU 72 prohibits the output adjustment of the high voltage-system voltage VH (step S200) and then terminates this process. When it is determined that the operation of the boost converter 40 is stopped, on the other hand, the CPU 72 obtains the inputs of the high voltage-system voltage VH from the voltage sensor 43*a*, the battery voltage VB from the voltage sensor 36*a* and the reactor current IL from the current sensor 41 (step S210). The CPU 72 subsequently sets a forward voltage Vf of the upper arm diode, based on the input reactor current IL and a current voltage characteristic f of the upper arm diode (diode D1) (step S220). One example of the current voltage characteristic f of the upper arm diode is shown in FIG. 4. The CPU 72 then performs output adjustment of the high voltage-system voltage VH, based on a value obtained by subtracting the forward voltage Vf from the input battery voltage VB (step S230). A procedure of the output adjustment of the high voltage-system voltage VH sets a value obtained by subtracting the forward voltage Vf from the battery voltage VB and further subtracting the result of this subtraction from the high voltage-system voltage VH, to a VH output adjustment value $\Delta VH$ and stores the VH output adjustment value $\Delta VH$ into a predetermined area of the RAM 76. After storing the VH zero point adjustment value $\Delta VH0$ and the VH output adjustment value $\Delta VH$, the CPU 72 creates a VH correction map that is used for correction of the high voltage-system voltage VH detected by the voltage sensor 43*a* (step S240) and then terminates this process. FIG. 5 is a diagram illustrating a procedure of creating the VH correction map. In this diagram, an abscissa shows the high voltage-system voltage VH detected by the voltage sensor 43*a*, and an ordinate shows a corrected voltage VH* after correction of the high voltage-system voltage VH. As illustrated, the procedure of creating the VH correction map sets combinations of the high voltage-system voltage VH and the corrected voltage VH* on a straight line passing through two points ($\Delta VH0$, 0) and (VH, VH–$\Delta VH$) in a plane defined by the abscissa and the ordinate.

Figure 6:
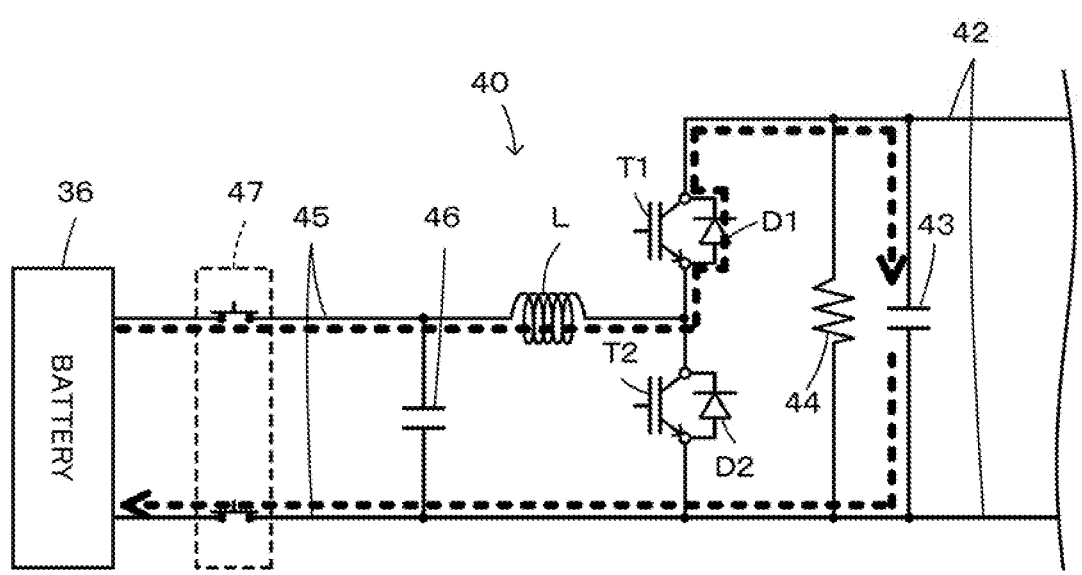
FIG. 6 is a diagram illustrating application of a forward voltage to the diode D1.

FIG. 6 is a diagram illustrating application of a forward voltage to the diode D1. As described above, the smoothing capacitor 43 and the discharge resistance 44 are connected with the high voltage-system power lines 42 such as to be arranged in parallel to each other. When the operation of the boost converter 40 is stopped, i.e., when both the transistors T1 and T2 are OFF, charge current flows from the battery 36 through the reactor L and the diode D1 (upper arm diode) toward the capacitor 43, accompanied with discharge of the capacitor 43 by means of the discharge resistance 44. In this state, the forward voltage Vf according to the current voltage characteristic f of the diode D1 illustrated in FIG. 4 is applied to the diode D1, so that the capacitor 43 is charged with a power having a voltage that is reduced from the battery voltage VB by the forward voltage Vf. The configuration of the embodiment accordingly performs output adjustment of the high voltage-system voltage VH detected by the voltage sensor 43*a*, based on the value obtained by subtracting the forward voltage Vf from the battery voltage VB. This configuration ensures the more appropriate output adjustment and thereby the more appropriate creation of the VH correction map.

As described above, the voltage conversion device of the first embodiment uses the VL correction map to correct the low voltage-system voltage VL detected by the voltage sensor 46a, while using the VH correction map to correct the high voltage-system voltage VH detected by the voltage sensor 43a. Creation of the VL correction map and creation of the VH correction map are performed as described below. When the system main relay 47 is OFF, the voltage conversion device performs zero point adjustment of the low voltage-system voltage VL detected by the voltage sensor 46a and also performs zero point adjustment of the high voltage-system voltage VH detected by the voltage sensor 43a. When the system main relay 47 is ON and the auxiliary machinery DC-DC converter 48 connected with the low voltage-system power lines 45 stops operation, the voltage conversion device performs output adjustment of the low voltage-system voltage VL detected by the voltage sensor 46a, based on the battery voltage VB detected by the voltage sensor 36a. The voltage conversion device then creates the VL correction map, based on the results of the zero point adjustment and the output adjustment of the low voltage-system voltage VL. This configuration accordingly enables the low voltage-system voltage VL to be appropriately corrected by using the VL correction map. When the system main relay 47 is ON, the operation of the auxiliary machinery DC-DC converter 48 is stopped and the operation of the boost converter 40 is stopped, the voltage conversion device sets the forward voltage Vf of the upper arm diode, based on the forward current (reactor current IL) flowing in the upper arm diode of the boost converter 40, and performs output adjustment of the high voltage-system voltage VH detected by the voltage sensor 43a, based on the voltage obtained by subtracting the forward voltage Vf from the battery voltage VB detected by the voltage sensor 36a. The voltage conversion device then creates the VH correction map, based on the results of the zero point adjustment and the output adjustment of the high voltage-system voltage VH. The capacitor 43 and the discharge resistance 44 are connected with the high voltage-system power lines 42 such as to be arranged in parallel to each other. When the operation of the boost converter 40 is stopped, charge current flows from the battery 36 through the reactor L and the upper arm diode toward the capacitor 43, accompanied with discharge of the capacitor 43 by means of the discharge resistance 44. In this state, the forward voltage is applied to the upper arm diode, so that the capacitor 43 is charged with the voltage that is reduced from the battery voltage VB by the forward voltage. The voltage conversion device accordingly performs output adjustment of the high voltage-system voltage VH detected by the voltage sensor 43a, based on the value obtained by subtracting the forward voltage Vf from the battery voltage VB. This ensures the more appropriate output adjustment. As a result, this configuration creates the appropriate VH correction map and thereby enables the high voltage-system voltage VH to be more appropriately corrected by using the VH correction map.

Second Embodiment

Figure 2:
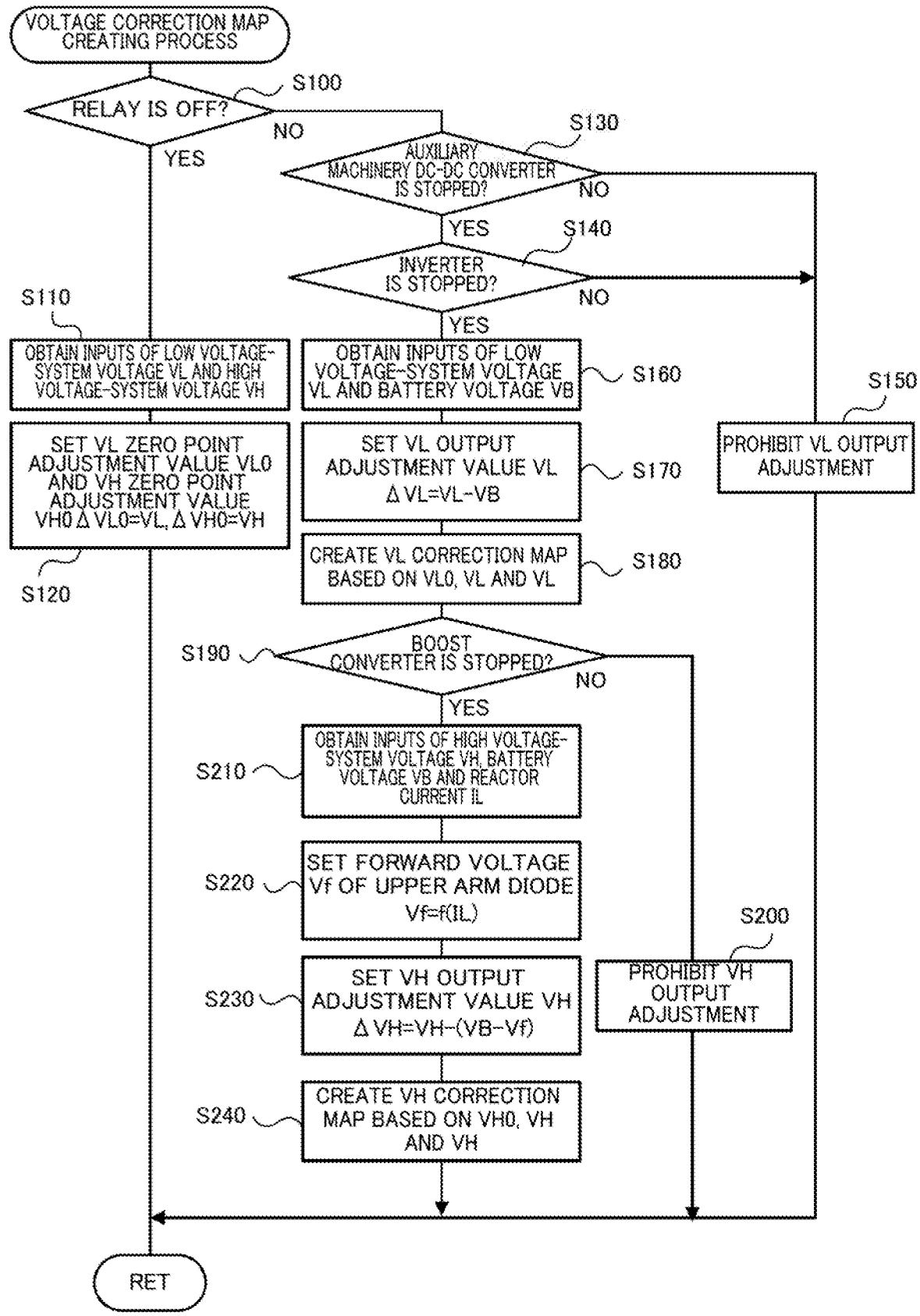
FIG. 2 is a flowchart showing one example of a voltage correction map creating process performed by an electronic control unit.
Figure 7:
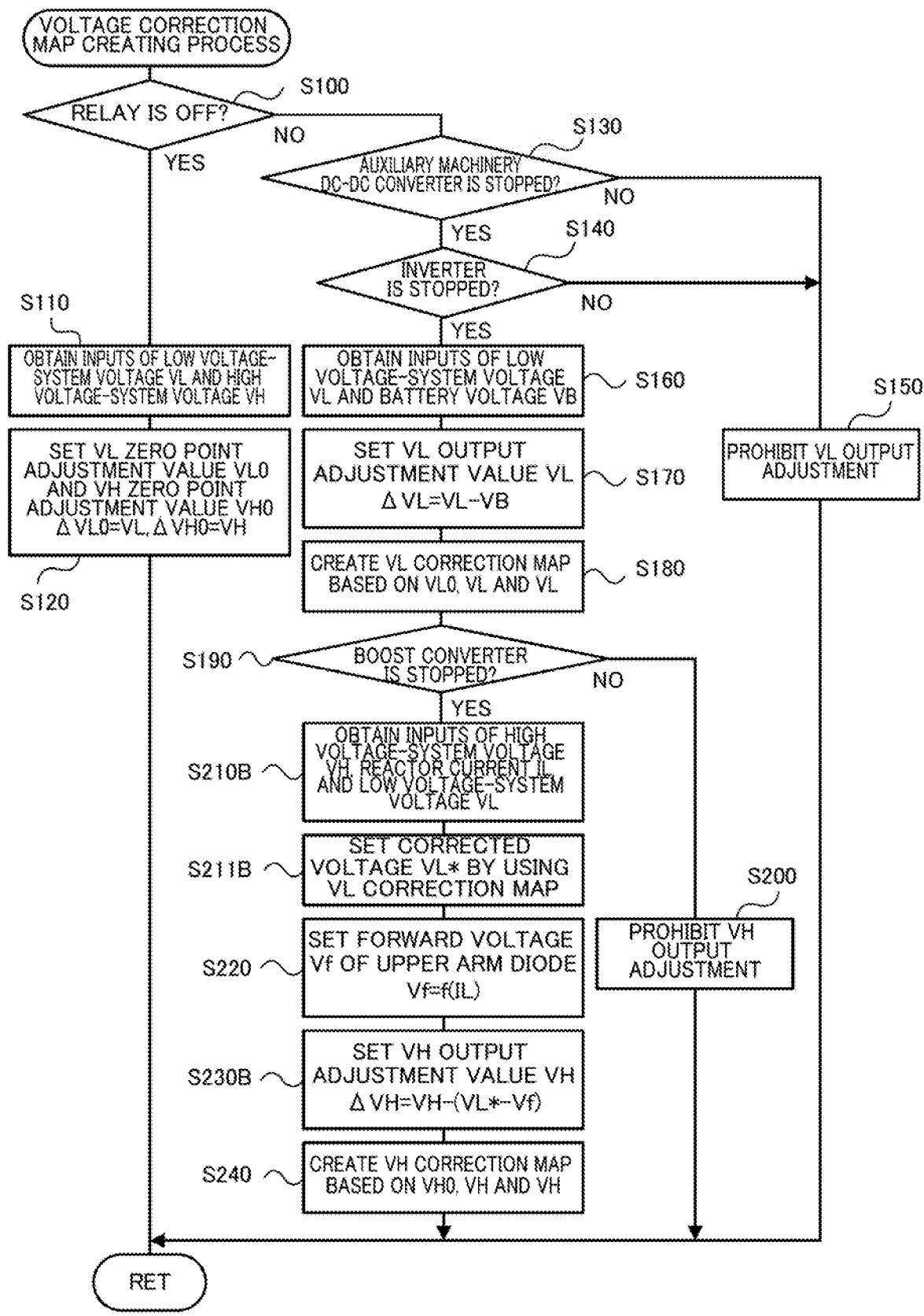
FIG. 7 is a flowchart showing a voltage correction map creating process according to a second embodiment.

A voltage conversion device according to a second embodiment is configured to correct the low voltage-system voltage VL detected by the voltage sensor 46a to a corrected voltage VL* by using the VL correction map created at step S180 and to perform output adjustment of the high voltage-system voltage VH, based on the corrected voltage VL*, in place of the battery voltage VB. FIG. 7 is a flowchart showing a voltage correction map creating process according to the second embodiment. The like steps, among the respective steps of the voltage correction map creating process of FIG. 7, to the steps of the voltage correction map creating process of FIG. 2 are expressed by the like step numbers, and their duplicated description is omitted.

In the voltage correction map creating process of the second embodiment, when it is determined at step S190 that the operation of the boost converter 40 is stopped, the CPU 72 obtains the inputs of the high voltage-system voltage VH from the voltage sensor 43a, the reactor current IL from the current sensor 41 and the low voltage-system voltage VL from the voltage sensor 46a (step S210B). The CPU 72 subsequently sets a corrected voltage VL* by using the VL correction map created at step S180 to correct the input low voltage-system voltage VL (step S211B). The CPU 72 then sets the forward voltage Vf of the upper arm diode, based on the input reactor current IL (step S220), and sets a VH output adjustment value ΔVH by subtracting the forward voltage Vf from the corrected voltage VL* and further subtracting the result of this subtraction from the input high voltage-system voltage VH (step S230B). At this time, the operations of all the auxiliary machinery DC-DC converter 48, the inverter 34 and the boost converter 40 are stopped, and the VL correction map has already been created at step S180. Accordingly, the corrected voltage VL* obtained by using the VL correction map to correct the low voltage-system voltage VL input from the voltage sensor 46a is equivalent to the battery voltage VB input from the voltage sensor 36a. Like the configuration of the first embodiment, this configuration of replacing the battery voltage VB at step S230 shown in FIG. 2 with the corrected voltage VL* ensures the appropriate output adjustment of the high voltage-system voltage VH.

Third Embodiment

Figure 8:
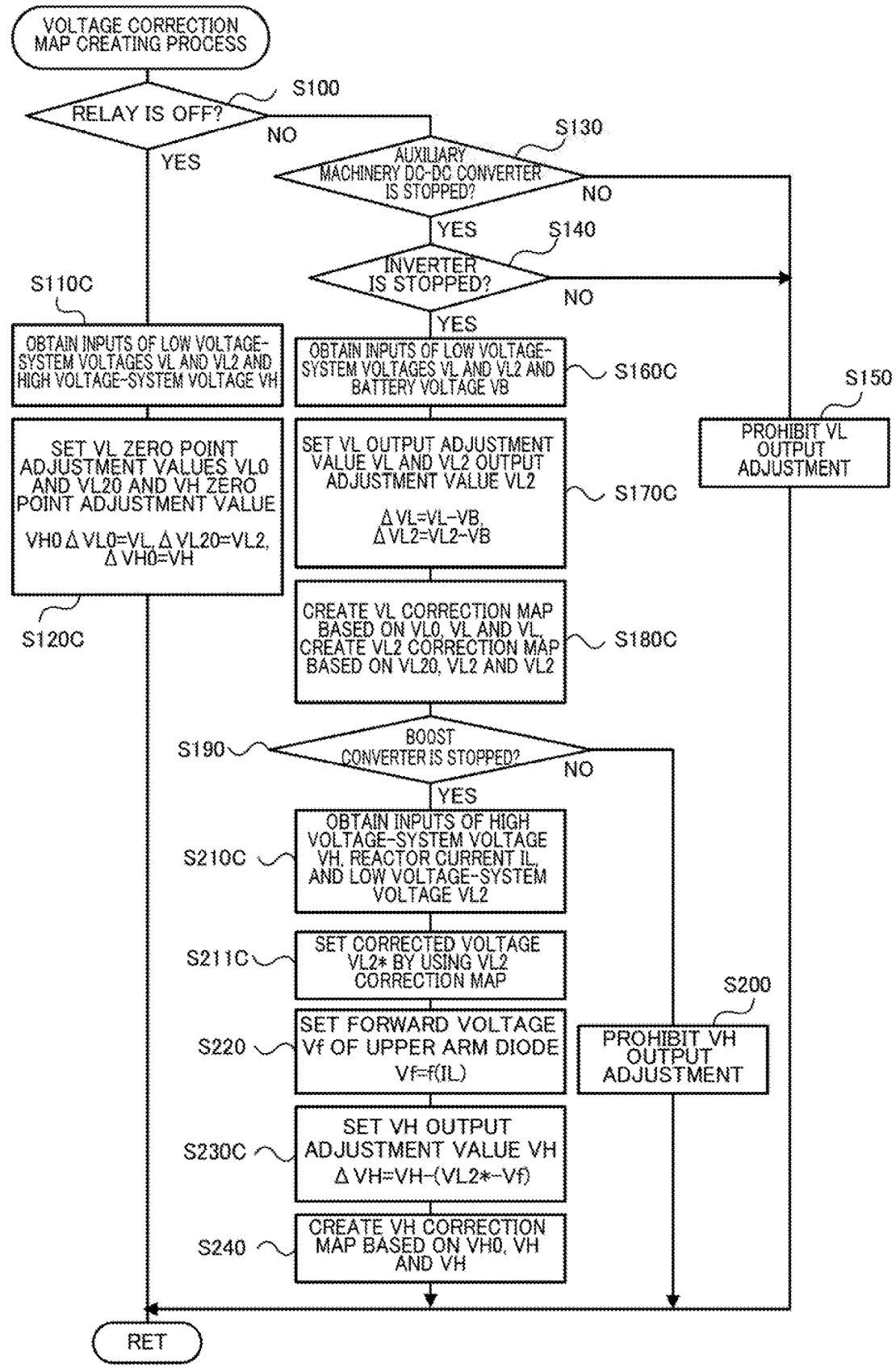
FIG. 8 is a flowchart showing a voltage correction map creating process according to a third embodiment.

A voltage conversion device according to a third embodiment is configured to create a correction map (VL2 correction map) that is used to correct a low voltage-system voltage VL2 detected by a voltage sensor 48a placed between input terminals of the auxiliary machinery DC-DC converter 48 and to perform output adjustment of the high voltage-system voltage VH detected by the voltage sensor 43a, based on a corrected voltage VL2* obtained by using the VL2 correction map to correct the low voltage-system voltage VL2 detected by the voltage sensor 48a, in place of the corrected voltage VL* of the second embodiment. FIG. 8 is a flowchart showing a voltage correction map creating process according to the third embodiment. The like steps, among the respective steps of the voltage correction map creating process of FIG. 8, to the steps of the voltage correction map creating process of FIG. 2 are expressed by the like step numbers, and their duplicated description is omitted.

In the voltage correction map creating process of the third embodiment, when it is determined at step S100 that the system main relay 47 is OFF, the CPU 72 obtains the inputs of the low voltage-system voltage VL2 from the voltage sensor 48a, in addition to the low voltage-system voltage VL from the voltage sensor 46a and the high voltage-system voltage VH from the voltage sensor 43a (step S110C). The CPU 72 subsequently performs zero point adjustment of the low voltage-system voltage VL2, in addition to the zero point adjustment of the low voltage-system voltage VL and the zero point adjustment of the high voltage-system voltage VH (step S120C). Like the zero point adjustment of the low voltage-system voltage VL, a procedure of the zero point adjustment of the low voltage-system voltage VL2 sets the input low voltage-system voltage VL2 to a VL2 zero point adjustment value ΔVL20 and stores the VL2 zero point adjustment value ΔVL20 into a predetermined area of the RAM 76.

When it is determined at step S100 that the system main relay 47 is ON, it is determined at step S130 that the operation of the auxiliary machinery DC-DC converter 48 is stopped, and it is determined at step S140 that the operation of the inverter 34 is stopped, the CPU 72 obtains the inputs of the low voltage-system voltages VL and VL2 from the voltage sensors 46a and 48a and the battery voltage VB from the voltage sensor 36a (step S160C), and performs output adjustment of the input low voltage-system voltage VL and output adjustment of the input low voltage-system voltage VL2, based on the input battery voltage VB (step S170C). Like the output adjustment of the low voltage-system voltage VL, a procedure of the output adjustment of the low voltage-system voltage VL2 sets a value obtained by subtracting the input battery voltage VB from the input low voltage-system voltage VL2, to a VL2 output adjustment value ΔVL2 and stores the VL2 output adjustment value ΔVL2 into a predetermined area of the RAM 76. After storing the VL2 zero point adjustment value ΔVL20 and the VL2 output adjustment value ΔVL2 along with storing the VL zero point adjustment value ΔVL0 and the VL output adjustment value ΔVL, the CPU 72 creates a VL correction map that is used to correct the low voltage-system voltage VL detected by the voltage sensor 46a and a VL2 correction map that is used to correct the low voltage-system voltage VL2 detected by the voltage sensor 48a (step S180C). Like the procedure of creating the VL correction map, a procedure of creating the VL2 correction map sets combinations of the low voltage-system voltage VL2 and a corrected voltage VL2* on a straight line passing through two points (ΔVL20, 0) and (VL2, VL2−ΔVL2).

When it is subsequently determined at step S190 that the operation of the boost converter 40 is stopped, the CPU 72 obtains the inputs of the high voltage-system voltage VH from the voltage sensor 43a, the reactor current IL from the current sensor 41 and the low voltage-system voltage VL2 from the voltage sensor 48a (step S210C). The CPU 72 then sets a corrected voltage VL2* by using the VL2 correction map created at step S180C to correct the input low voltage-system voltage VL2 (step S211C). The CPU 72 subsequently sets the forward voltage Vf of the upper arm diode, based on the input reactor current IL (step S220), and sets a VH output adjustment value ΔVH by subtracting the forward voltage Vf from the corrected voltage VL2* and further subtracting the result of this subtraction from the input high voltage-system voltage VH (step S230C). Like the configuration of the first embodiment, this configuration of replacing the battery voltage VB at step S230 shown in FIG. 2 with the corrected voltage VL2* ensures the appropriate output adjustment of the high voltage-system voltage VH.

Fourth Embodiment

Figure 9:
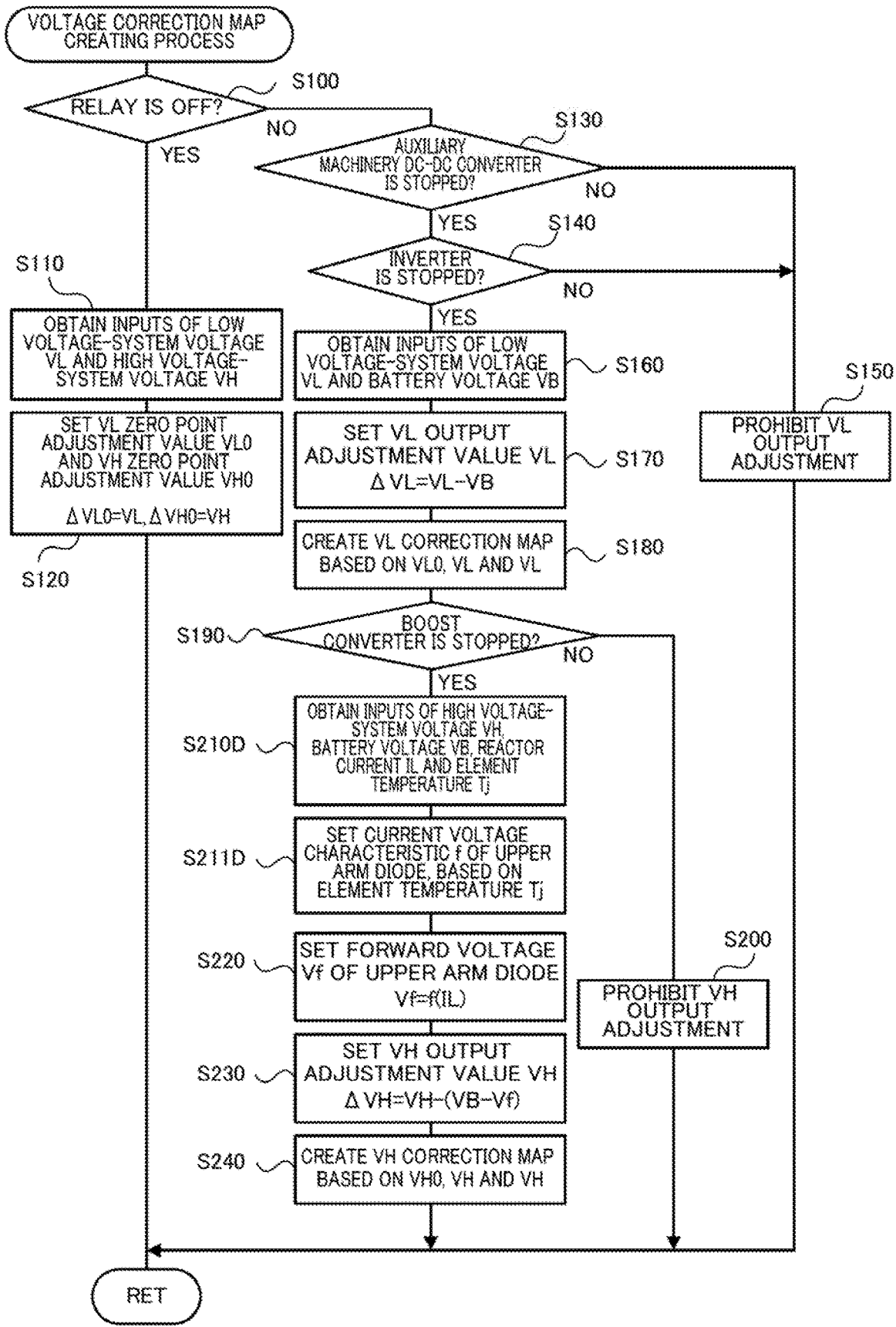
FIG. 9 is a flowchart showing a voltage correction map creating process according to a fourth embodiment.

A voltage conversion device according to a fourth embodiment is configured to set a forward voltage Vf of the upper arm diode by changing the current voltage characteristic based on an element temperature Tj of the upper arm diode. FIG. 9 is a flowchart showing a voltage correction map creating process according to the fourth embodiment. The like steps, among the respective steps of the voltage correction map creating process of FIG. 9, to the steps of the voltage correction map creating process of FIG. 2 are expressed by the like step numbers, and their duplicated description is omitted.

Figure 10:
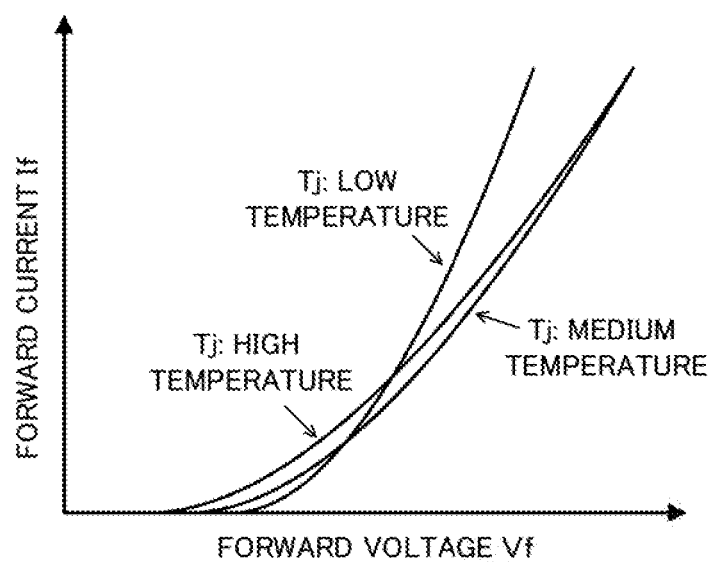
FIG. 10 is a diagram illustrating forward voltage setting maps according to the fourth embodiment.

In the voltage correction map creating process of the fourth embodiment, when it is determined at step S190 that the operation of the boost converter 40 is stopped, the CPU 72 obtains the inputs of an element temperature Tj of the upper arm diode, in addition to the high voltage-system voltage VH from the voltage sensor 43a, the battery voltage VB from the voltage sensor 36a and the reactor current IL from the current sensor 41 (step S210D). The element temperature Tj may be detected by, for example, a temperature sensing diode or a thermistor. In a configuration provided with a cooling system to cool down a PCU (power control unit) including the boost converter 40 and the inverter 34 by means of a cooling medium (cooling water), the element temperature Tj may be estimated from a detected temperature of the cooling medium. The CPU 72 subsequently sets a current voltage characteristic f of the upper arm diode (forward voltage setting map), based on the input element temperature Tj (step S211D), and then sets a forward voltage Vf of the upper arm diode, based on the reactor current IL by using the set current voltage characteristic f (step S220). One example of the forward voltage setting maps according to the fourth embodiment is shown in FIG. 10. As illustrated, a plurality of different forward voltage setting maps are provided according to the element temperature Tj of the upper arm diode. This configuration enables the more accurate forward voltage Vf to be set irrespective of the element temperature Tj and thereby ensures the more appropriate output adjustment of the high voltage-system voltage VH.

The configurations of the first to the fourth embodiments described above use the VL correction map to correct the low voltage-system voltage VL input from the voltage sensor 46a, while using the VH correction map to correct the high voltage-system voltage VH input from the voltage sensor 43a. A modification may use a relational expression of the low voltage-system voltage VL and the corrected voltage VL* (VL correction equation), instead of using the VL correction map or may use a relational expression of the high voltage-system voltage VH and a corrected value VH* (VH correction equation), instead of using the VH correction map. The VL correction equation may be an expression of determining a straight line passing through two points (ΔVL0, 0) and (VL, VL−ΔVL). The VH correction equation may be an expression of determining a straight line passing through two points (ΔVH0, 0) and (VH, VH−ΔVH).

The foregoing describes the application of the voltage conversion device of the present disclosure to the electric vehicle 20. The voltage conversion device may also be applied to a hybrid vehicle. The application of the voltage conversion device is, however, not limited to moving bodies such as vehicles, but may be any stationary driving systems. More specifically, the voltage conversion device of the present disclosure may be applied to any device or system that is placed between a low voltage-system power line connected with a power storage device and a high voltage-system power line connected with an electric load and that is configured to perform voltage conversion.

As described above, the voltage conversion device of the present disclosure includes a voltage conversion circuit that includes an upper arm switching element, a lower arm switching element connected in series with the upper arm switching element, an upper arm diode connected in parallel with the upper arm switching element in a reverse direction, a lower arm diode connected in parallel with the lower arm switching element in the reverse direction, and a reactor connected between the upper arm switching element and the lower arm switching element and that is placed between a low voltage-system power line connected with a power storage device and a high voltage-system power line connected with an electric load to perform voltage conversion, a low voltage-system capacitor provided on the low voltage-system power line, a high voltage-system capacitor provided on the high voltage-system power line, a discharge element configured to discharge an electric charge of the high voltage-system capacitor, a low voltage-system voltage detector configured to detect a low voltage-system voltage that is a voltage of the low voltage-system capacitor, a high voltage-system voltage detector configured to detect a high voltage-system voltage that is a voltage of the high voltage-system capacitor, a power storage voltage detector configured to detect a power storage voltage that is a voltage of the power storage device, a relay that is provided on the low voltage-system power line, and a control device configured to use a low voltage-system voltage correction map or a low voltage-system voltage correction equation to correct the low voltage-system voltage detected by the low voltage-system voltage detector and to use a high voltage-system voltage correction map or a high voltage-system voltage correction equation to correct the high voltage-system voltage detected by the high voltage-system voltage detector. When the relay is off, the control device performs zero point adjustment of the low voltage-system voltage detected by the low voltage-system voltage detector; and performs zero point adjustment of the high voltage-system voltage detected by the high voltage-system voltage, when the relay is on and the low voltage-system power line has no electric power consumption, the control device performs output adjustment of the low voltage-system voltage detected by the low voltage-system voltage detector, based on the power storage voltage detected by the power storage voltage detector; and creates the low voltage-system voltage correction map or the low voltage-system voltage correction equation, based on results of the zero point adjustment and the output adjustment of the low voltage-system voltage, and when the relay is on, the low voltage-system power line has no electric power consumption, and the voltage conversion circuit does not perform voltage conversion, the control device estimates a forward voltage of the upper arm diode; performs output adjustment of the high voltage-system voltage detected by the high voltage-system voltage detector, based on a voltage calculated by subtracting the forward voltage from the power storage voltage detected by the power storage voltage detector or based on a voltage calculated by subtracting the forward voltage from a corrected voltage, which is obtained by correcting the low voltage-system voltage detected by the low voltage-system voltage detector; and creates the high voltage-system voltage correction map or the high voltage-system voltage correction equation, based on results of the zero point adjustment and the output adjustment of the high voltage-system voltage.

The voltage conversion device according to this aspect of the present disclosure uses the low voltage-system voltage correction map or the low voltage-system voltage correction equation to correct the low voltage-system voltage detected by the low voltage-system voltage detector, while using the high voltage-system voltage correction map or the high voltage-system voltage correction equation to correct the high voltage-system voltage detected by the high voltage-system voltage detector. Creation of the low voltage-system voltage correction map or the low voltage-system voltage correction equation and creation of the high voltage-system voltage correction map or the high voltage-system voltage correction equation may be performed as described below. When the relay is off, the voltage conversion device performs zero point adjustment of the low voltage-system voltage detected by the low voltage-system voltage detector and also performs zero point adjustment of the high voltage-system voltage detected by the high voltage-system voltage detector. When the relay is on and the low voltage-system power line has no electric power consumption, the voltage conversion device performs output adjustment of the low voltage-system voltage detected by the low voltage-system voltage detector, based on the power storage voltage detected by the power storage voltage detector. The voltage conversion device then creates the low voltage-system voltage correction map or the low voltage-system voltage correction equation, based on the results of the zero point adjustment and the output adjustment of the low voltage-system voltage. This configuration enables the low voltage-system voltage to be corrected appropriately. When the relay is on, the low voltage-system power line has no electric power consumption and the voltage conversion circuit does not perform voltage conversion, the voltage conversion device estimates the forward voltage of the upper arm diode, and performs output adjustment of the high voltage-system voltage detected by the high voltage-system voltage detector, based on the voltage calculated by subtracting the forward voltage from the power storage voltage detected by the power storage voltage detector or based on the voltage calculated by subtracting the forward voltage from the corrected voltage that is obtained by correcting the low voltage-system voltage detected by the low voltage-system voltage detector. The voltage conversion device then creates the high voltage-system voltage correction map or the high voltage-system voltage correction equation, based on the results of the zero point adjustment and output adjustment of the high voltage-system voltage. The capacitor (high voltage-system capacitor) and the discharge element are connected with the high voltage-system power line. When the operation of the voltage conversion circuit is stopped, charge current flows from the power storage device through the reactor and the upper arm diode toward the capacitor, accompanied with discharge of the capacitor by means of the discharge element. At this time, the forward voltage is applied to the upper arm diode, so that the capacitor is charged with a power having a voltage that is reduced from the power storage voltage by the forward voltage. The voltage conversion device accordingly performs output adjustment of the high voltage-system voltage detected by the high voltage-system voltage detector, based on the value obtained by subtracting the forward voltage from the power storage voltage or from the corrected voltage that is obtained by correcting the low voltage-system voltage. This configuration ensures the more appropriate output adjustment. As a result, this configuration enables the high voltage-system voltage to be corrected more appropriately.

In the voltage conversion device of the above aspect may include a current detector configured to detect a forward current that flows in the upper arm diode, the control device may estimate the forward voltage of the upper arm diode, based on the forward current detected by the current detector and a current voltage characteristic of the upper arm diode. In this case, the control device may set the current voltage characteristic, based on a temperature of the upper arm diode. This configuration enables the forward voltage of the upper arm diode to be estimated more accurately and thereby ensures the more appropriate output adjustment of the high voltage-system voltage.

In the voltage conversion device of the above aspect may include a low voltage-system power circuit connected with the low voltage-system power line and configured to supply electric power to a low voltage-system power consuming apparatus, the low voltage-system power line may have no electric power consumption, when the low voltage-system power circuit is not operated. In this case, the low voltage-system voltage detector may include a first low voltage-system voltage detector and a second low voltage-system voltage detector that is provided in the low voltage-system power circuit and that is different from the first low voltage-system voltage detector, and the control device may use a first low voltage-system voltage correction map or a first low voltage-system voltage correction equation to correct a first low voltage-system voltage detected by the first low voltage-system voltage detector, and may use a second low voltage-system voltage correction map or a second low voltage-system voltage correction equation to correct a second low voltage-system voltage detected by the second low voltage-system voltage detector. When the relay is off, the control device may perform zero point adjustment of the first low voltage-system voltage detected by the first low voltage-system voltage detector, may perform zero point adjustment of the second low voltage-system voltage detected by the second low voltage-system voltage detector, and may perform zero point adjustment of the high voltage-system voltage detected by the high voltage-system voltage detector. When the relay is on and the low voltage-system power circuit is not operated, the control device may perform output adjustment of the first low voltage-system voltage detected by the first low voltage-system voltage detector, based on the power storage voltage detected by the power storage voltage detector; may perform output adjustment of the second low voltage-system voltage detected by the second low voltage-system voltage detector, based on the power storage voltage detected by the power storage voltage detector; may create the first low voltage-system voltage correction map or the first low voltage-system voltage correction equation, based on results of the zero point adjustment and the output adjustment of the first low voltage-system voltage; and may create the second low voltage-system voltage correction map or the second low voltage-system voltage correction equation, based on results of the zero point adjustment and the output adjustment of the second low voltage-system voltage. And when the relay is on, the low voltage-system power circuit is not operated, and the voltage conversion circuit does not perform voltage conversion, the control device may estimate the forward voltage of the upper arm diode; may perform output adjustment of the high voltage-system voltage detected by the high voltage-system voltage detector, based on a voltage calculated by subtracting the forward voltage from a corrected voltage that is obtained by correcting the second low voltage-system voltage detected by the second low voltage-system voltage detector, and may create the high voltage-system voltage correction map or the high voltage-system voltage correction equation, based on results of the zero point adjustment and the output adjustment of the high voltage-system voltage detector. This configuration enables the output adjustment of the high voltage-system voltage to be appropriately performed by using the second low voltage-system voltage detected by the second low voltage-system voltage detector provided in the low voltage-system power circuit.

The following describes the correspondence relationship between the primary elements of the above embodiment and the primary elements of the disclosure described in Summary. The transistor T1 of the embodiment corresponds to the "upper arm switching element", the transistor T2 corresponds to the "lower arm switching element", the diode D1 corresponds to the "upper arm diode", the diode D2 corresponds to the "lower arm diode", the reactor L corresponds to the "reactor", the battery 36 corresponds to the "power storage device", the inverter 34 (motor 32) corresponds to the "electric load", the boost converter 40 corresponds to the "voltage conversion circuit", the capacitor 46 corresponds to the "low voltage-system capacitor", the capacitor 43 corresponds to the "high voltage-system capacitor", the discharge resistance 44 corresponds to the "discharge element", the voltage sensor 46a corresponds to the "low voltage-system voltage detector", the voltage sensor 43a corresponds to the "high voltage-system voltage detector", the voltage sensor 36a corresponds to the "power storage voltage detector", the system main relay 47 corresponds to the "relay", the electronic control unit 70 corresponds to the "control device", the current sensor 41 corresponds to the "current detector", the auxiliary machinery DC-DC converter 48 corresponds to the "low voltage-system power circuit", the voltage sensor 46a corresponds to the "first low voltage-system voltage detector", and the voltage sensor 48a corresponds to the "second low voltage-system voltage detector".

The correspondence relationship between the primary components of the embodiment and the primary components of the present disclosure, regarding which the problem is described in Summary, should not be considered to limit the components of the present disclosure, regarding which the problem is described in Summary, since the embodiment is only illustrative to specifically describes the aspects of the present disclosure, regarding which the problem is described in Summary. In other words, the present disclosure, regarding which the problem is described in Summary, should be interpreted on the basis of the description in Summary, and the embodiment is only a specific example of the present disclosure, regarding which the problem is described in Summary.

The aspect of the present disclosure is described above with reference to the embodiment. The present disclosure is, however, not limited to the above embodiment but various modifications and variations may be made to the embodiment without departing from the scope of the present disclosure.

INDUSTRIAL APPLICABILITY

The disclosure is applicable to, for example, the manufacturing industries of voltage conversion devices.

What is claimed is:
1. A voltage conversion device, comprising:
a voltage conversion circuit that includes an upper arm switching element, a lower arm switching element connected in series with the upper arm switching element, an upper arm diode connected in parallel with the upper arm switching element in a reverse direction, a lower arm diode connected in parallel with the lower arm switching element in the reverse direction, and a reactor connected between the upper arm switching element and the lower arm switching element and that is placed between a low voltage-system power line connected with a power storage device and a high voltage-system power line connected with an electric load to perform voltage conversion;
a low voltage-system capacitor provided on the low voltage-system power line;

a high voltage-system capacitor provided on the high voltage-system power line;
a discharge element configured to discharge an electric charge of the high voltage-system capacitor;
a low voltage-system voltage detector configured to detect a low voltage-system voltage that is a voltage of the low voltage-system capacitor;
a high voltage-system voltage detector configured to detect a high voltage-system voltage that is a voltage of the high voltage-system capacitor;
a power storage voltage detector configured to detect a power storage voltage that is a voltage of the power storage device;
a relay that is provided on the low voltage-system power line; and
a control device configured to use a low voltage-system voltage correction map or a low voltage-system voltage correction equation to correct the low voltage-system voltage detected by the low voltage-system voltage detector and to use a high voltage-system voltage correction map or a high voltage-system voltage correction equation to correct the high voltage-system voltage detected by the high voltage-system voltage detector, wherein
when the relay is off, the control device performs zero point adjustment of the low voltage-system voltage detected by the low voltage-system voltage detector; and performs zero point adjustment of the high voltage-system voltage detected by the high voltage-system voltage detector,
when the relay is on and the low voltage-system power line has no electric power consumption, the control device performs output adjustment of the low voltage-system voltage detected by the low voltage-system voltage detector, based on the power storage voltage detected by the power storage voltage detector; and creates the low voltage-system voltage correction map or the low voltage-system voltage correction equation, based on results of the zero point adjustment and the output adjustment of the low voltage-system voltage, and
when the relay is on, the low voltage-system power line has no electric power consumption, and the voltage conversion circuit does not perform voltage conversion, the control device estimates a forward voltage of the upper arm diode; performs output adjustment of the high voltage-system voltage detected by the high voltage-system voltage detector, based on a voltage calculated by subtracting the forward voltage from the power storage voltage detected by the power storage voltage detector or based on a voltage calculated by subtracting the forward voltage from a corrected voltage, which is obtained by correcting the low voltage-system voltage detected by the low voltage-system voltage detector; and creates the high voltage-system voltage correction map or the high voltage-system voltage correction equation, based on results of the zero point adjustment and the output adjustment of the high voltage-system voltage.

2. The voltage conversion device according to claim 1, further comprising:
a current detector configured to detect a forward current that flows in the upper arm diode, wherein
the control device estimates the forward voltage of the upper arm diode, based on the forward current detected by the current detector and a current voltage characteristic of the upper arm diode.

3. The voltage conversion device according to claim 2,
wherein the control device sets the current voltage characteristic, based on a temperature of the upper arm diode.

4. The voltage conversion device according to claim 1, further comprising:
a low voltage-system power circuit connected with the low voltage-system power line and configured to supply electric power to a low voltage-system power consuming apparatus, wherein
the low voltage-system power line has no electric power consumption, when the low voltage-system power circuit is not operated.

5. The voltage conversion device according to claim 4,
wherein the low voltage-system voltage detector comprises a first low voltage-system voltage detector and a second low voltage-system voltage detector that is provided in the low voltage-system power circuit and that is different from the first low voltage-system voltage detector, and
the control device uses a first low voltage-system voltage correction map or a first low voltage-system voltage correction equation to correct a first low voltage-system voltage detected by the first low voltage-system voltage detector, and uses a second low voltage-system voltage correction map or a second low voltage-system voltage correction equation to correct a second low voltage-system voltage detected by the second low voltage-system voltage detector, wherein
when the relay is off, the control device performs zero point adjustment of the first low voltage-system voltage detected by the first low voltage-system voltage detector; performs zero point adjustment of the second low voltage-system voltage detected by the second low voltage-system voltage detector; and performs zero point adjustment of the high voltage-system voltage detected by the high voltage-system voltage detector,
when the relay is on and the low voltage-system power circuit is not operated, the control device performs output adjustment of the first low voltage-system voltage detected by the first low voltage-system voltage detector, based on the power storage voltage detected by the power storage voltage detector; performs output adjustment of the second low voltage-system voltage detected by the second low voltage-system voltage detector, based on the power storage voltage detected by the power storage voltage detector; creates the first low voltage-system voltage correction map or the first low voltage-system voltage correction equation, based on results of the zero point adjustment and the output adjustment of the first low voltage-system voltage; and creates the second low voltage-system voltage correction map or the second low voltage-system voltage correction equation, based on results of the zero point adjustment and the output adjustment of the second low voltage-system voltage, and
when the relay is on, the low voltage-system power circuit is not operated, and the voltage conversion circuit does not perform voltage conversion, the control device estimates the forward voltage of the upper arm diode; performs output adjustment of the high voltage-system voltage detected by the high voltage-system voltage detector, based on a voltage calculated by subtracting the forward voltage from a corrected voltage that is obtained by correcting the second low voltage-system voltage detected by the second low voltage-system voltage detector; and creates the high voltage-system voltage correction map or the high voltage-system voltage correction equation, based on results of the zero point adjustment and the output adjustment of the high voltage-system voltage.

* * * * *